United States Patent
Yu et al.

(10) Patent No.: US 9,029,882 B2
(45) Date of Patent: May 12, 2015

(54) ACTIVE DEVICE ARRAY SUBSTRATE

(71) Applicant: HannStar Display Corporation, New Taipei (TW)

(72) Inventors: Chia-Hua Yu, New Taipei (TW); Sung-Chun Lin, Tainan (TW); Chung-Lin Chang, Kaohsiung (TW); Chien-Ting Chan, Tainan (TW); Hsuan-Chen Liu, Kaohsiung (TW)

(73) Assignee: HannStar Display Corporation, New Taipei (TW)

( * ) Notice: Subject to any disclaimer, the term of this patent is extended or adjusted under 35 U.S.C. 154(b) by 0 days.

(21) Appl. No.: 13/974,073

(22) Filed: Aug. 23, 2013

(65) Prior Publication Data

US 2014/0252381 A1    Sep. 11, 2014

(30) Foreign Application Priority Data

Mar. 7, 2013    (CN) .......................... 2013 1 0072309

(51) Int. Cl.
*H01L 27/12* (2006.01)
*G02F 1/1362* (2006.01)

(52) U.S. Cl.
CPC ...... *H01L 27/1214* (2013.01); *G02F 1/136213* (2013.01); *G02F 2001/136222* (2013.01)

(58) Field of Classification Search
CPC .......................... H01L 25/0753; H01L 27/153
USPC ............ 257/59, 79, 82, 88, E33.001; 438/19, 438/22, 30
See application file for complete search history.

(56) References Cited

U.S. PATENT DOCUMENTS

| | | | |
|---|---|---|---|
| 2009/0115947 A1* | 5/2009 | Huang et al. .................. | 349/106 |
| 2010/0165272 A1* | 7/2010 | Li et al. ......................... | 349/106 |
| 2011/0001909 A1* | 1/2011 | Tseng et al. .................. | 349/106 |
| 2011/0007250 A1* | 1/2011 | Ono .............................. | 349/106 |
| 2011/0156038 A1* | 6/2011 | Yang et al. ..................... | 257/59 |
| 2011/0263057 A1* | 10/2011 | Huang et al. .................. | 438/30 |
| 2011/0267325 A1* | 11/2011 | Xi et al. ........................ | 345/211 |
| 2011/0304805 A1* | 12/2011 | Tseng et al. .................. | 349/106 |

* cited by examiner

*Primary Examiner* — Karen Kusumakar
*Assistant Examiner* — Adam S Bowen
(74) *Attorney, Agent, or Firm* — CKC & Partners Co., Ltd.

(57) ABSTRACT

An active device array substrate for saving material cost includes a substrate, scan lines, data lines, a thin film transistor, a color filter layer, a transparent conductive layer, an insulating layer and a pixel electrode. The color filter layer covers and contacts the scan lines, data lines and the thin film transistor. The transparent conductive layer is disposed on the color filter layer and electrically isolated from the scan lines, the data lines and the thin film transistor by the color filter layer. The insulating layer covers the transparent conductive layer. The pixel electrode is disposed on the insulating layer and connected to the thin film transistor.

10 Claims, 4 Drawing Sheets

ACTIVE DEVICE ARRAY SUBSTRATE

RELATED APPLICATIONS

This application claims priority to China Application Serial Number 201310072309.7, filed Mar. 7, 2013, which is herein incorporated by reference.

BACKGROUND

1. Technical Field

The present disclosure relates to an active device array substrate.

2. Description of Related Art

A liquid crystal panel has been widely applied as a display because the liquid crystal panel has advantages of compact size, lightweight, thin thickness and low power consumption compared to a cathode ray tube (CRT) monitor. Therefore, the flat display panel such as the liquid crystal display has completely taken over the traditional CRT monitor in recent years becoming the mainstream products in the market.

The liquid crystal display panel mainly includes an active device array substrate, a color filter substrate and a liquid crystal layer interposed therebetween. In general, the active device array substrate is made from a number of metal layers and a number of insulating layers by photolithography and etching processes. In other words, the materials and the processing steps respectively have certain costs. Therefore, how to save the cost of material for the active device array substrate has always been an important issue to be solved.

SUMMARY

One object of the present disclosure provides an active device array substrate having a high aperture ratio and capable of saving material cost.

One aspect of the present disclosure provides an active device array substrate including a substrate, scan lines, data lines, at least one thin film transistor, a color filter layer, a transparent conductive layer, an insulating layer and at least one pixel electrode. The scan lines are disposed on the substrate. The data lines are disposed on the substrate, and the data lines and the scan lines intersect with each other to define sub-pixel areas of the substrate. The thin film transistor is electrically connected to one of the scan lines and one of the data lines. The color filter layer covers and contacts the scan lines, the data lines and the thin film transistor. The transparent conductive layer is disposed on the color filter layer and electrically isolated from the scan lines, the data lines and the thin film transistor by the color filter layer. The insulating layer covers the transparent conductive layer. The pixel electrode is disposed on the insulating layer and covers one of the sub-pixel areas, and the pixel electrode is connected to the thin film transistor.

According to one embodiment of the present disclosure, the color filter layer includes color filter patterns adjacent and contacting each other.

According to one embodiment of the present disclosure, at least two of the color filter patterns are partially overlapped with each other.

According to one embodiment of the present disclosure, the transparent conductive layer provides a common voltage potential.

According to one embodiment of the present disclosure, the transparent conductive layer covers and contacts the color filter layer.

According to one embodiment of the present disclosure, the transparent conductive layer covers the sub-pixel areas of the substrate and the data lines.

According to one embodiment of the present disclosure, the transparent conductive layer further covers the scan lines and the thin film transistor.

According to one embodiment of the present disclosure, the color filter layer has a first through hole exposing a portion of the thin film transistor.

According to one embodiment of the present disclosure, the insulating layer has a second through hole disposed on the first through hole exposing the portion of the thin film transistor.

According to one embodiment of the present disclosure, the pixel electrode is connected to the thin film transistor through the first through hole and the second through hole.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1:
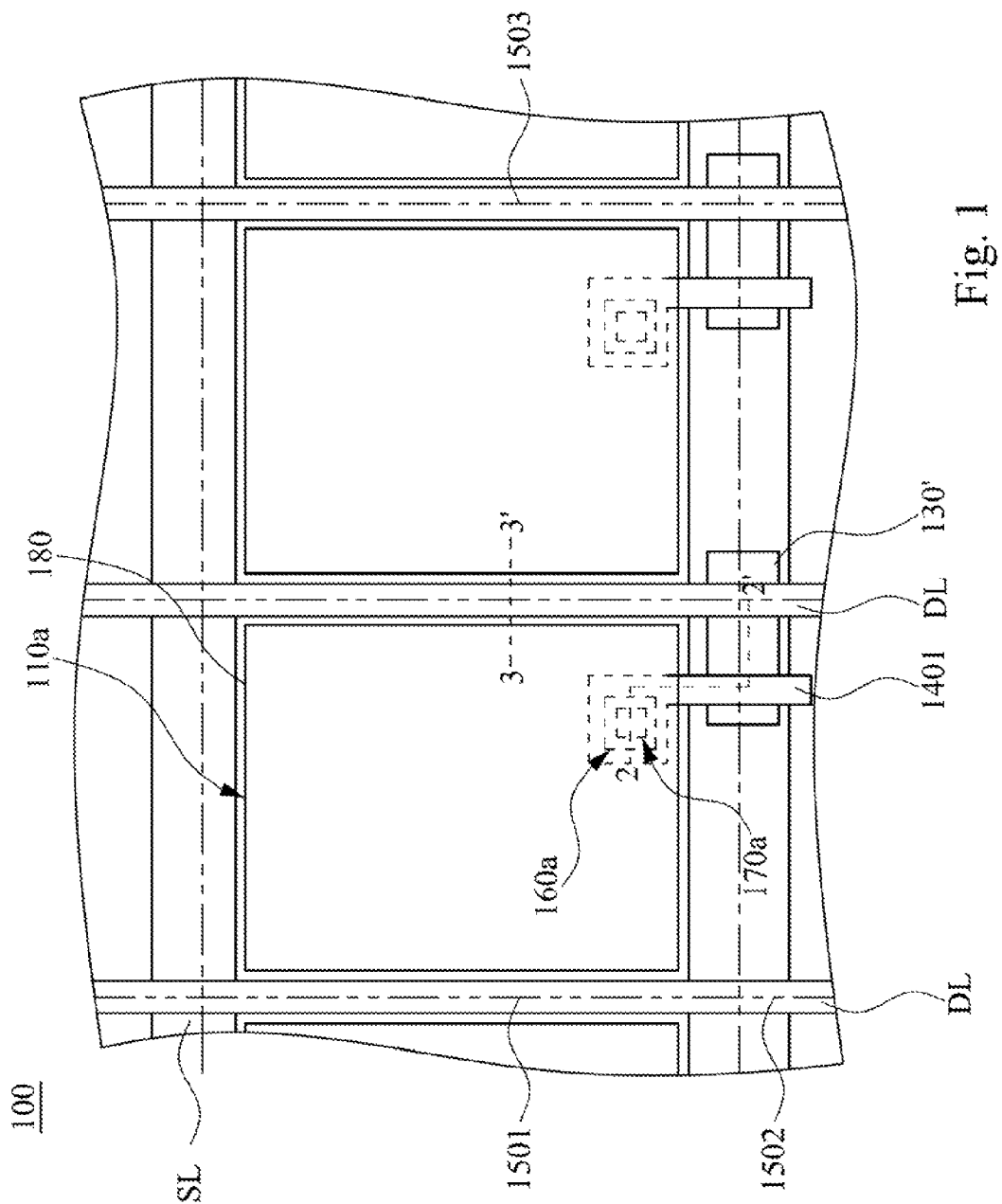
FIG. 1 is a top view of an active device array substrate according to one embodiment of the present disclosure.

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

As used herein, the singular forms "an" and the include plural referents unless the context clearly dictates otherwise. Therefore, reference to, for example, a thin film transistor includes aspects having two or more such thin film transistors, unless the context clearly indicates otherwise.

Reference will now be made in detail to the embodiments of the present disclosure, examples of which are illustrated in the accompanying drawings. Wherever possible, the same reference numbers are used in the drawings and the description to refer to the same or like parts.

Figure 2A:
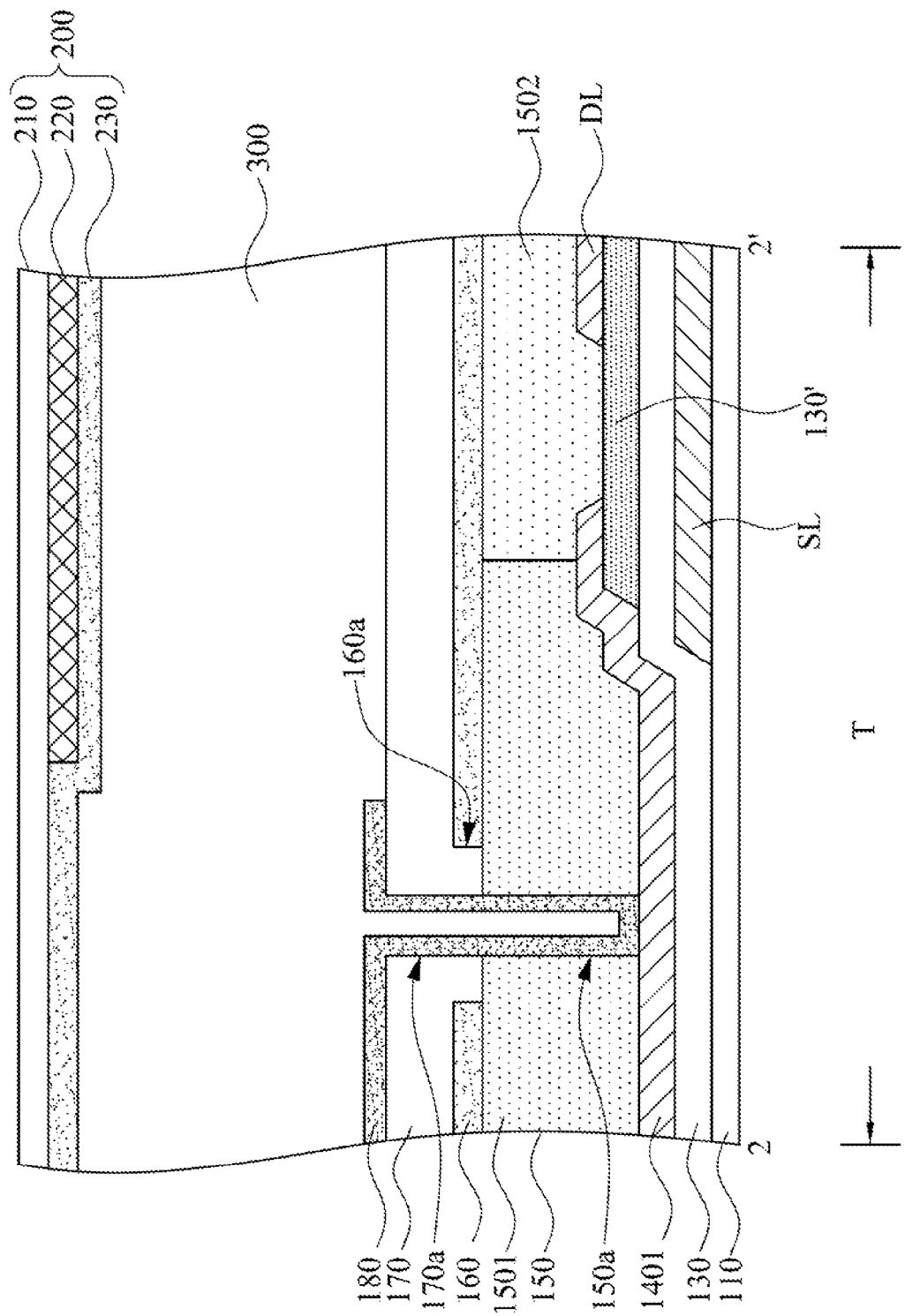
FIGS. 2A-2B are cross-sectional views of the active device array substrate taken along the line 2-2 of FIG. 1.
Figure 2B:
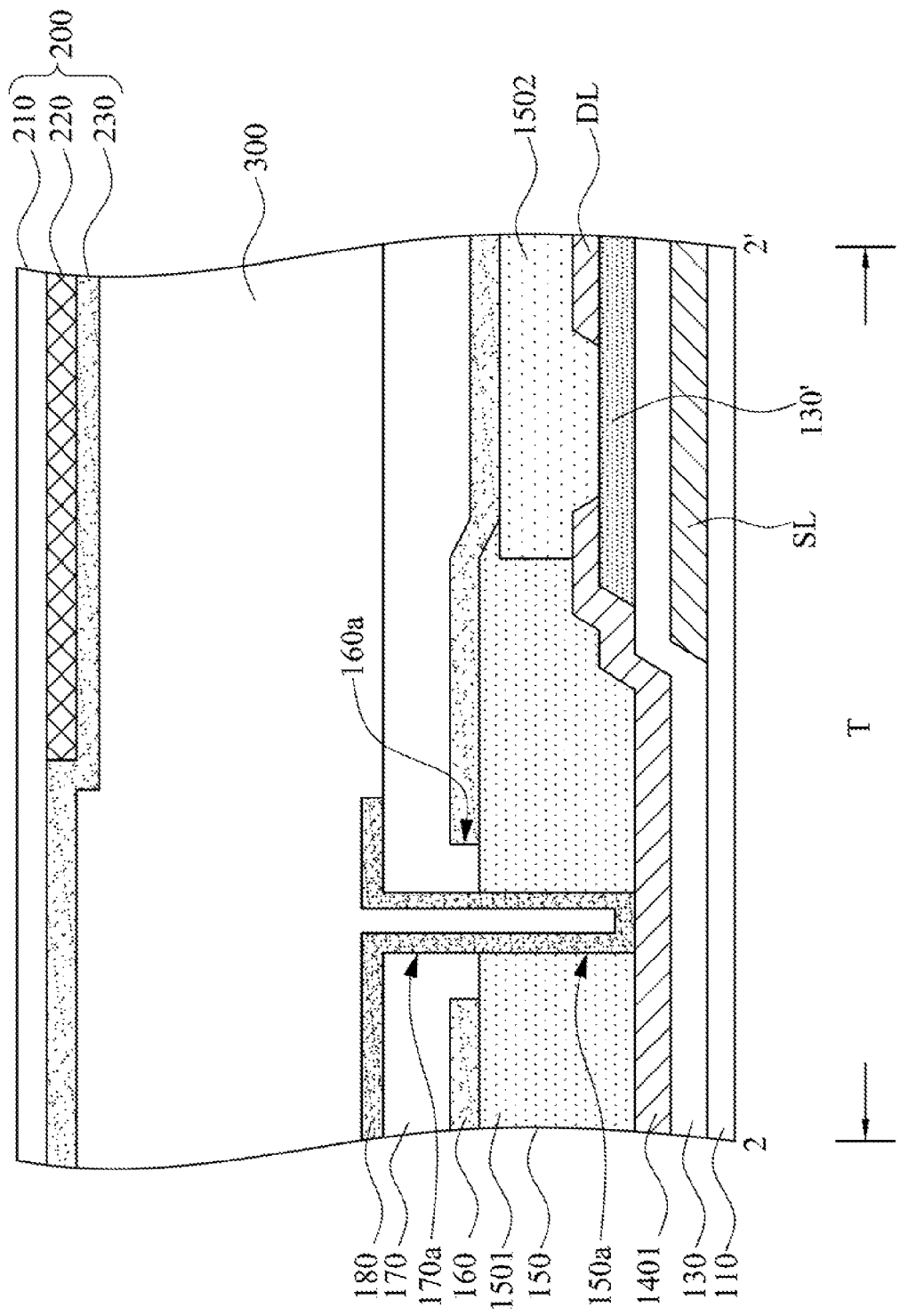

FIG. 1 is a top view of an active device array substrate 100 according to one embodiment of the present disclosure. FIGS. 2A-2B are cross-sectional views of the active device array substrate 100 taken along the line 2-2' of FIG. 1. The embodiments shown in FIG. 2A and FIG. 2B are various embodiments.

Referring to FIG. 1 and FIG. 2A, the active device array substrate 100 includes a substrate 110, scan lines SL, data lines DL, a thin film transistor T, a color filter layer 150, a transparent conductive layer 160, an insulating layer 170 and a pixel electrode 180.

The substrate 110 should have a high light transmittance and sufficient mechanical strength, such as glass, quartz, transparent polymeric materials or other suitable materials.

The scan lines SL parallel to each other are disposed on the substrate 110, as shown in FIG. 1. Of course, common lines (not shown) may be disposed on the substrate 110. The common lines (not shown) may be parallel to an extending direction of scan lines SL.

The data lines DL parallel to each other are disposed on the substrate 110, and the data lines DL and the scan lines SL intersect with each other so as to define sub-pixel areas 110a of the substrate 110. The scan lines SL and the data lines DL may be made of a material including a metal, such as molybdenum (Mo), chromium (Cr), aluminum (Al), neodymium (Nd), titanium (Ti), other suitable materials or a combination thereof.

The thin film transistor T corresponds to one of the sub-pixel areas 110a and is disposed on the substrate 110. The thin film transistor T is electrically connected to one of the scan lines SL and one of the data lines DL. Of course, a number of thin film transistors T may be respectively disposed on the sub-pixel regions 110a of the substrate 110. In the embodiment, a portion of the scan line SL is acted as a gate electrode, and a portion of the data line DL is acted as a source electrode, as shown in FIGS. 1 and 2A. That is, the thin film transistor T includes the gate electrode (i.e., the portion of the scan line SL), the source electrode (i.e., the portion of the data line DL), a drain electrode 1401 and an active layer 130'. Further, a gate dielectric layer 130 is interposed between the active layer 130' and the gate electrode (i.e., the portion of the scan line SL), as shown in FIG. 2A. Of course, the skilled in the art should understand that the thin film transistor T might be a bottom-gate type (as shown in FIG. 1) or a top-gate type (not shown) thin film transistor. Therefore, the layout can be appropriately altered and not limited to the embodiment shown in FIG. 1.

The gate dielectric layer 130 covers the scan lines SL, as shown in FIG. 2A. The gate dielectric layer 130 may be made of a material including an organic dielectric material, an inorganic dielectric material or a combination thereof. The organic dielectric material may be polyimide (PI), derivatives thereof, other suitable materials or a combination thereof. The inorganic material may be silicon oxide, silicon nitride, other suitable materials or a combination thereof. In one embodiment, the gate dielectric layer 130 blanket covers the sub-pixel areas 110a of the substrate 110 and the scan lines SL.

The active layer 130' is disposed on the gate dielectric layer 130, shown in FIGS. 1 and 2A. The active layer 130' may be made of a material including amorphous silicon, polycrystalline silicon, monocrystalline silicon, an organic semiconductor, an oxide semiconductor, other suitable materials or a combination thereof. In practical applications, both the shape and the location of the active layer 130' are not limited to the embodiment shown in FIG. 1.

The color filter layer 150 covers and contacts the scan lines SL, the data lines DL and the thin film transistor T, as shown in FIG. 2A. That is, the color filter layer 150 is utilized to protect the scan lines SL, the data lines DL and the thin film transistor T therebeneath.

In the embodiment, the color filter layer 150 includes a number of color filter patterns adjacent and contacting each other. Since light passing through the color filter layer 150 should perform different colors, the junctions between the color filter patterns should be located on the opaque elements such as the scan lines SL or the data lines DL.

The color filter patterns may be made of color photoresists (e.g., red, green, blue or other color photoresists) or other suitable materials. As shown in FIGS. 1 and 2A, the color filter layer 150 includes color filter patterns 1501, 1502, 1503, and each thereof corresponds to one of the sub-pixel areas 110a. For instance, the color filter patterns on the sub-pixel areas 110a are made from different color photoresists by photolithography and curing processes. The color filter patterns are adjacent and contacting each other to constitute the color filter layer 150 without any gap.

In another embodiment, two color filter patterns 1501, 1502 are partially overlapped on the scan lines SL. As such, there is no gap between the color filter patterns 1501, 1502.

The transparent conductive layer 160 is disposed on the color filter layer 150 and electrically isolated from the scan lines SL, the data lines DL and the thin film transistor T by the color filter layer 150. As shown in FIG. 2A, the transparent conductive layer 160 covers and contacts the color filter layer 150. Because the color filter layer 150 is made of a dielectric material and there is no gap therein, it can be acted as a protective layer between the transparent conductive layer 160, and the scan lines SL, the data lines DL and the thin film transistor T. Also, there is no need for disposing another protective layer to cover the thin film transistor T, the scan lines SL and the data lines DL, such that the material cost can be saved.

In one embodiment, the transparent conductive layer 160 provides a common voltage potential. That is, a common voltage is applied to the transparent conductive layer 160 to make it has the common voltage potential.

Figure 3:
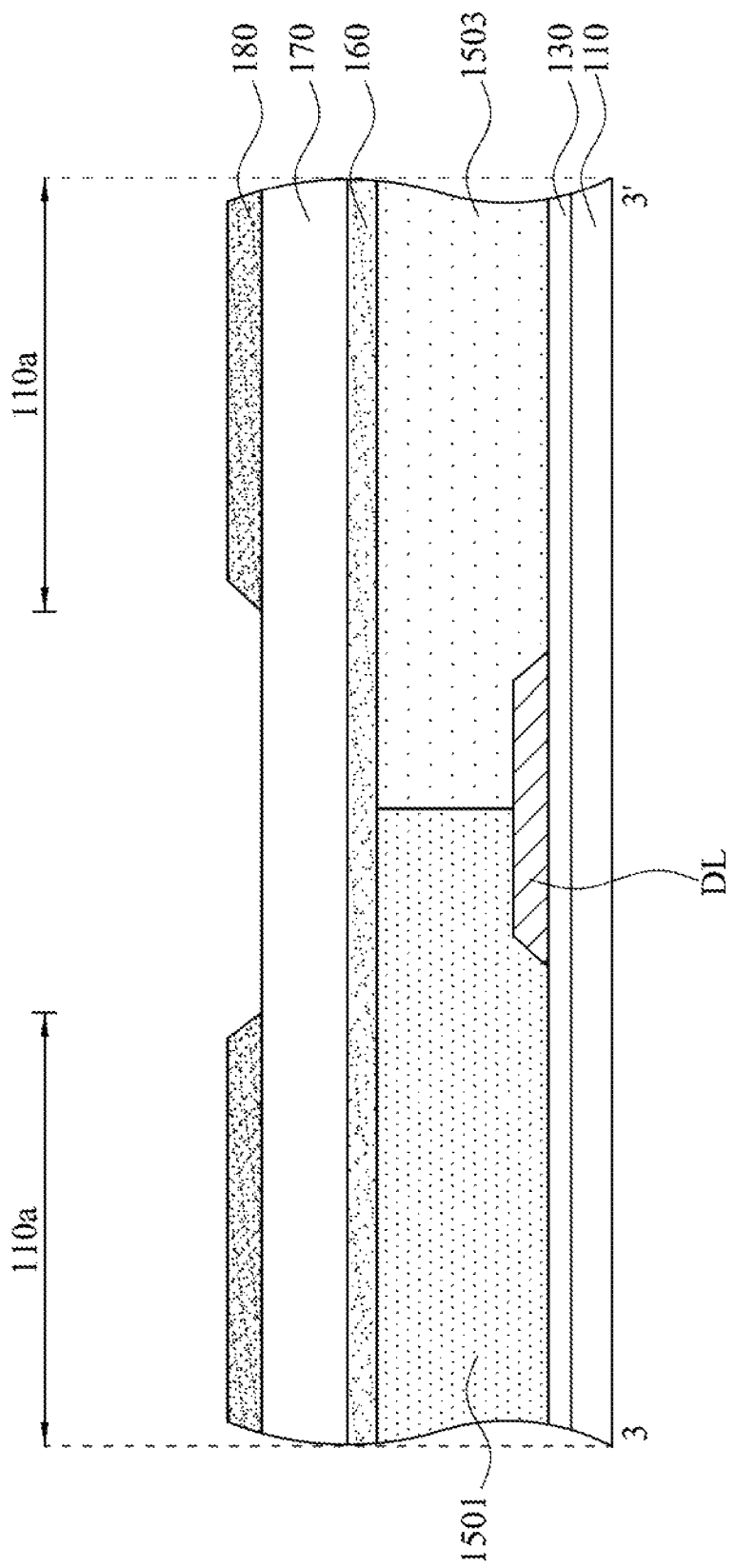
FIG. 3 is a cross-sectional view of the active device array substrate taken along the line 3-3' of FIG. 1.

In one embodiment, the transparent conductive layer 160 covers the color filter patterns 1501, 1503, the sub-pixel area 110a of the substrate therebeneath and the data line DL, as shown in FIG. 3. Therefore, the transparent conductive layer 160 shields the data lines DL to avoid the signal of a pixel electrode 180 being interfered therefrom. Hence, the problems of reverse domain and light leakage caused by a capacitive coupling effect between the data line DL and the pixel electrode 180 can be avoided.

In another embodiment, the transparent conductive layer 160 further covers the scan lines SL and the thin film transistor T, as shown in FIG. 2A. That is, the transparent conductive layer 160 blanket covers the color filter layer 150 (i.e., the transparent conductive layer 160 fully covers the sub-pixel areas 110a of the substrate 110, the data lines DL, the scan lines SL and the thin film transistor T) to fully shield the data lines DL, the scan lines SL and the thin film transistor T so as to avoid the signal of the pixel electrode 180 being interfered therefrom.

Moreover, an embodiment that the transparent conductive layer 160 covers the sub-pixel areas 110a of the substrate 110 and the data lines DL but does not cover the scan lines SL has lower RC loading of the transparent conductive layer 160 than another embodiment that the transparent conductive layer 160 blanket covers the color filter layer 150.

The insulating layer 170 covers the transparent conductive layer 160, and the pixel electrode 180 corresponds to one sub-pixel area 110a and is disposed on the insulating layer 170, as shown in FIG. 2A. Of course, the pixel electrodes 180 may respectively correspond to the sub-pixel areas 110a and be disposed on the insulating layer 170.

The pixel electrode 180 is connected to the thin film transistor T. For instance, as shown in FIG. 2A, the color filter layer 150 has a first through hole 150a exposing a portion of the drain electrode 1401 of the thin film transistor T. The insulating layer 170 has a second through hole 170a disposed on the first through hole 150a exposing the portion of the drain electrode 1401. Therefore, the pixel electrode 180 is connected to the drain electrode 1401 of the thin film transistor T through the first through hole 150a and the second through hole 170a.

The transparent conductive layer 160, the insulating layer 170 and the pixel electrode 180 constitutes a large-size transparent capacitor, such that the active device array substrate of the present disclosure has a higher aperture ratio than a conventional active device array substrate with a metal capacitor. In one embodiment, the transparent conductive layer 160 has a slit pattern (i.e., there is no transparent conductive layer 160 in the slit) to adjust a capacitance of the capacitor. Further, as shown in FIG. 2A, the transparent conductive layer 160 has an opening 160a, such that the pixel electrode 180 in the second through hole 170a is isolated from the transparent conductive layer 160.

The transparent conductive layer 160 and the pixel electrode 180 may be made of indium tin oxide (ITO), indium zinc oxide (IZO), indium gallium zinc oxide (IGZO) or other suitable transparent conductive materials. The material of the pixel electrode 180 may be the same as or different from that of the transparent conductive layer 160.

The display panel includes not only the active device array substrate 100 but also an opposite substrate 200 and a display medium layer 300, as shown in FIG. 2A. Each of the elements of the active device array substrate 100 may refer to the above description, and thus it is omitted herein.

The opposite substrate 200 is parallel to the active device array substrate 100. In the embodiment, the opposite substrate 200 includes an opposite plate 210 and a light-shielding layer 220. The light-shielding layer 220 corresponds to the scan lines SL and the data lines DL of the active device array substrate 100. Since the active device array substrate 100 includes the color filter layer 150, there is no need for disposing another color filter layer on the opposite plate 210.

Concerning a twisted nematic liquid crystal display (TN-LCD), the opposite substrate 200 further includes an opposite transparent electrode 230 covering the light-shielding layer 220 and the opposite plate 210, as shown in FIG. 2A. A voltage between the opposite transparent electrode 230 and the pixel electrode 180 can be utilized to control the twist angle of the liquid crystal molecules so as to control the degree of light penetration.

Concerning an in-plane switching liquid crystal display (IPS-LCD), there is no need for disposing an opposite transparent electrode in the opposite substrate 200, but a number of strip-shaped pixel electrodes (not shown) and a common electrode (not shown) should be provided and disposed on the sub-pixel area 110a of the substrate 110 of the active device array substrate 100. A lateral electric field formed between the strip-shaped pixel electrodes and the common electrode can be utilized to control the twist angle of the liquid crystal molecules.

The display medium layer 300 is interposed between the active device array substrate 100 and the opposite substrate 200. The display medium layer 300 may be made of liquid crystal, an electro-wetting material, a self-luminous material or other suitable materials.

As can be seen from the above description, the color filter layer of the embodiments of the present disclosure is acted as a protective layer for protecting the wires and the thin film transistors therebeneath, such that the material cost can be saved. Further, the transparent conductive layer shields the wires and the thin film transistors so as to avoid light leakage caused by a capacitive coupling effect. The display panel has a high aperture ratio, since the transparent conductive layer, the insulating layer and the pixel electrodes constitutes a transparent capacitor. In summary, the present disclosure indeed provides an active device array substrate having a high aperture ratio and capable of effectively saving the material cost.

Although the present disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the present disclosure without departing from the scope or spirit of the disclosure. In view of the foregoing, it is intended that the present disclosure cover modifications and variations thereof provided they fall within the scope of the following claims.

What is claimed is:

1. An active device array substrate, comprising:
a substrate;
a plurality of scan lines disposed on the substrate;
a plurality of data lines disposed on the substrate, wherein the data lines and the scan lines intersect with each other to define a plurality of sub-pixel areas of the substrate;
at least one thin film transistor electrically connected to one of the scan lines and one of the data lines;
a color filter layer covering and contacting the data lines and an active layer of the thin film transistor;
a transparent conductive layer disposed on the color filter layer and electrically isolated from the data lines and the active layer of the thin film transistor by the color filter layer;
an insulating layer disposed on the transparent conductive layer, and the transparent conductive layer between the color filter layer and the insulating layer; and
at least one pixel electrode disposed on the insulating layer and covering one of the sub-pixel areas, the pixel electrode being connected to the thin film transistor.

2. The active device array substrate of claim 1, wherein the color filter layer comprises a plurality of color filter patterns adjacent and contacting each other.

3. The active device array substrate of claim 2, wherein at least two of the color filter patterns are partially overlapped with each other.

4. The active device array substrate of claim 1, wherein the transparent conductive layer provides a common voltage potential.

5. The active device array substrate of claim 1, wherein the transparent conductive layer covers and contacts the color filter layer.

6. The active device array substrate of claim 1, wherein the transparent conductive layer covers the sub-pixel areas of the substrate and the data lines.

7. The active device array substrate of claim 6, wherein the transparent conductive layer further covers the scan lines and the thin film transistor.

8. The active device array substrate of claim 1, wherein the color filter layer has a first through hole exposing a portion of the thin film transistor.

9. The active device array substrate of claim 8, wherein the insulating layer has a second through hole disposed on the first through hole exposing the portion of the thin film transistor.

10. The active device array substrate of claim 9, wherein the pixel electrode is connected to the thin film transistor through the first through hole and the second through hole.

* * * * *